United States Patent [19]
Hwang

[11] Patent Number: 6,146,994
[45] Date of Patent: Nov. 14, 2000

[54] METHOD FOR FORMING SELF-ALIGNED SELECTIVE SILICIDE LAYER USING CHEMICAL MECHANICAL POLISHING IN MERGED DRAM LOGIC

[75] Inventor: In-seak Hwang, Kyungki-do, Rep. of Korea

[73] Assignee: Samsung Electronics Co., Ltd., Suwon, Rep. of Korea

[21] Appl. No.: 09/298,904

[22] Filed: Apr. 26, 1999

[30] Foreign Application Priority Data

Jun. 8, 1998 [KR] Rep. of Korea ...................... 98-21065
Feb. 4, 1999 [KR] Rep. of Korea ........................ 99-3756

[51] Int. Cl.[7] .............................................. H01L 21/4763
[52] U.S. Cl. .......................... 438/633; 438/303; 438/592; 438/634; 438/655; 438/664; 438/682; 438/253
[58] Field of Search .................................... 438/633, 634, 438/649, 651, 655, 663–664, 682, 592–594, 581, 583, 299, 303, 230, 253

[56] References Cited

U.S. PATENT DOCUMENTS

| | | |
|---|---|---|
| 5,026,666 | 6/1991 | Hills et al. ................................ 438/301 |
| 5,891,785 | 4/1999 | Chang ...................................... 438/305 |
| 6,025,267 | 2/2000 | Pey et al. ................................. 438/656 |

*Primary Examiner*—Charles Bowers
*Assistant Examiner*—Thanh Nguyen
*Attorney, Agent, or Firm*—Jones Volentine, LLC

[57] ABSTRACT

A semiconductor device including a first area where a silicide layer is formed only on a gate electrode, and a second area where a silicide layer is formed both on the gate electrode and on source and drain areas is produced by a method wherein a polishing stopper and an oxide layer are sequentially stacked, the gate electrode is exposed in a self-aligned manner, and then a first silicide layer is formed to thereby suppress misalignment in the process of manufacturing a semiconductor device having a fine linear width. In the first area, when first and second insulating layers are stacked and contact holes are formed directly connected to the semiconductor substrate, a second silicide layer is formed at the bottoms of the contact holes, to reduce contact resistance and leakage current.

14 Claims, 8 Drawing Sheets

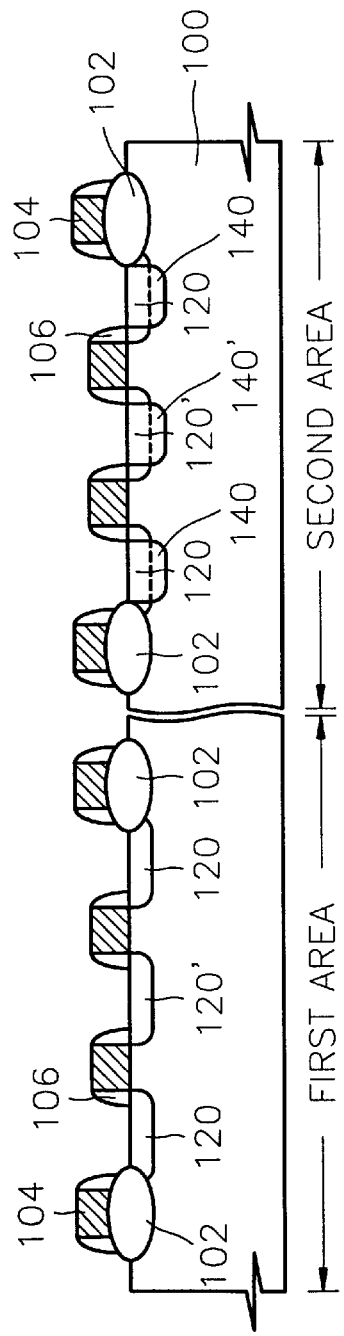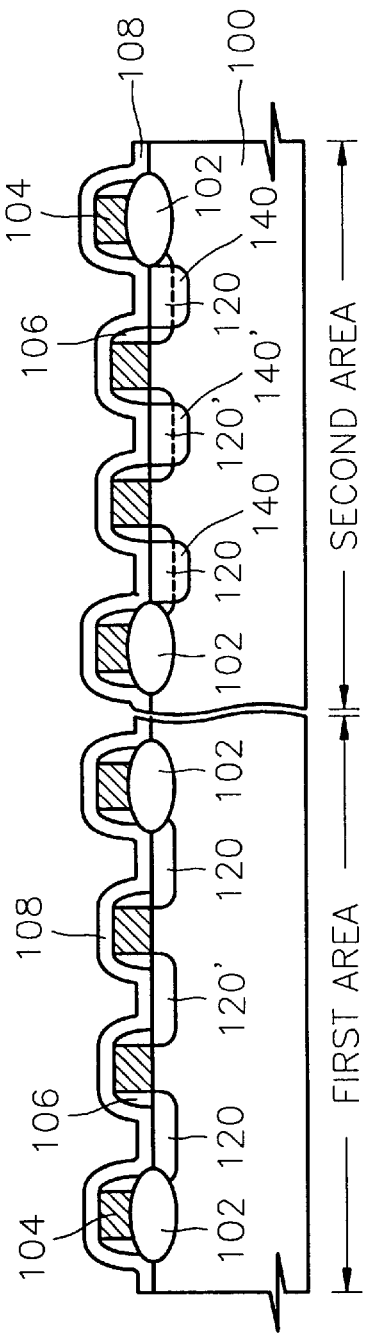

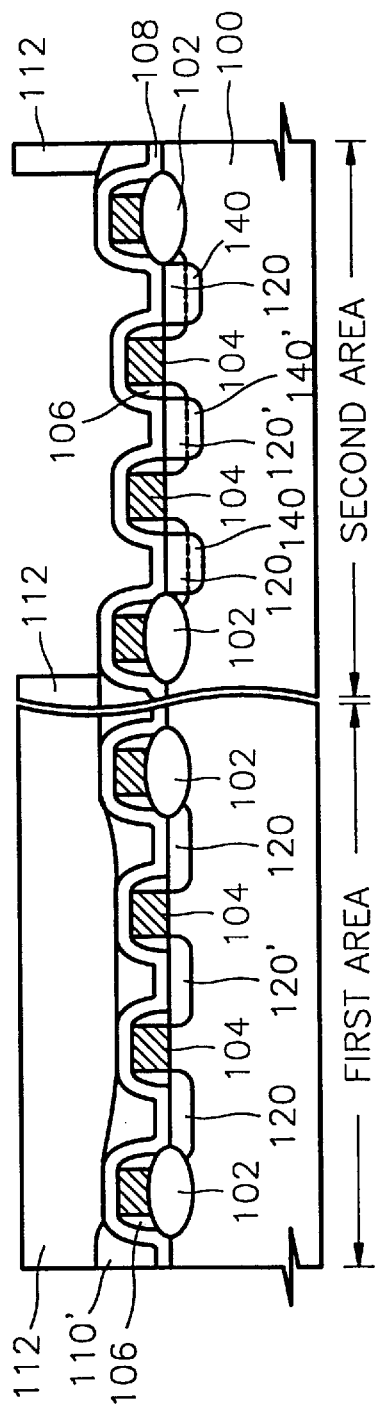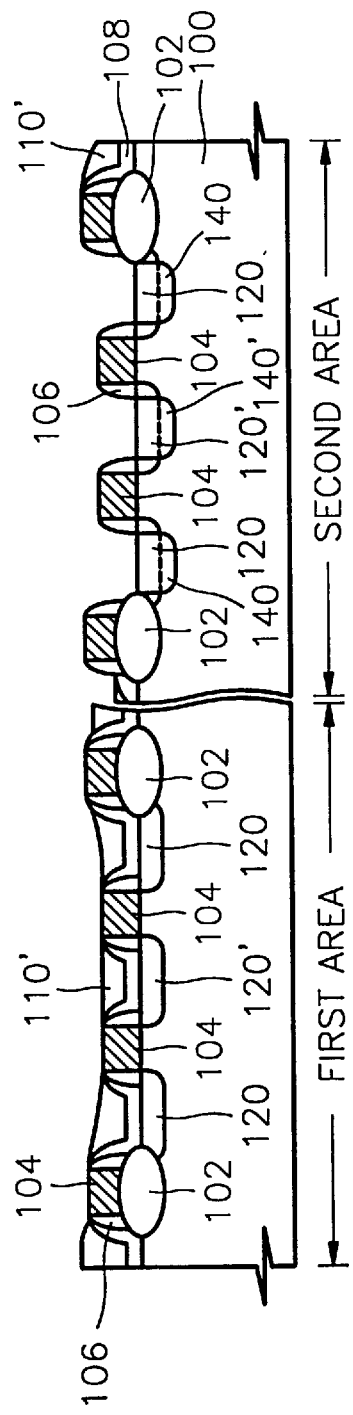

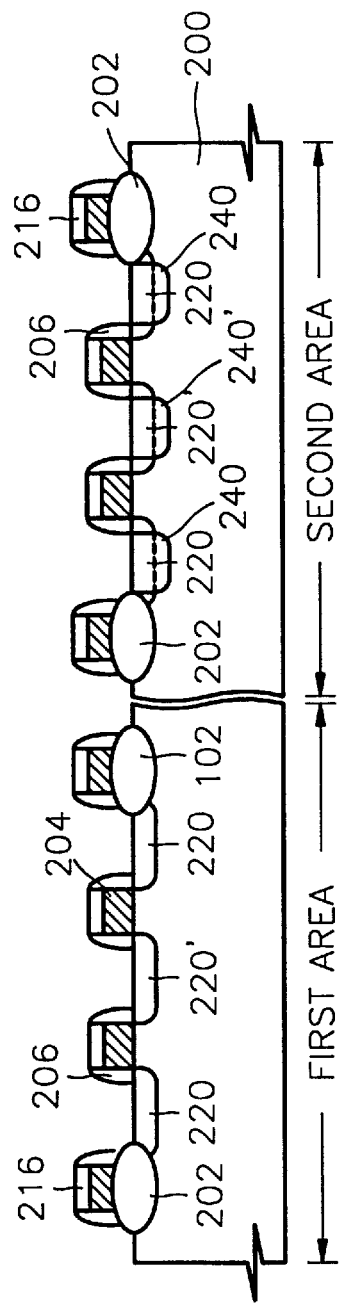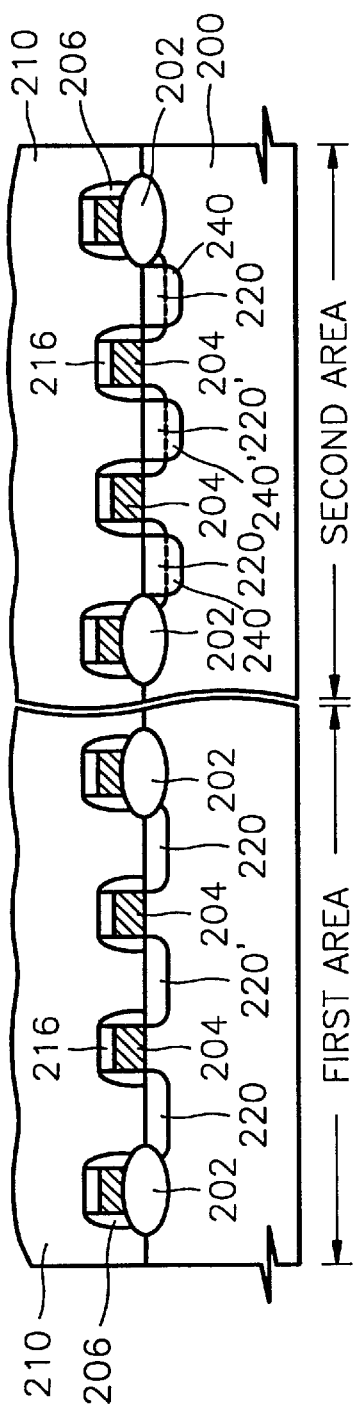

METHOD FOR FORMING SELF-ALIGNED SELECTIVE SILICIDE LAYER USING CHEMICAL MECHANICAL POLISHING IN MERGED DRAM LOGIC

BACKGROUND OF THE INVENTION

1. Field of the Invention

The present invention relates to a method for manufacturing a semiconductor integrated circuit, and more particularly, to a method for forming a suicide layer of a semiconductor device in which a DRAM and a logic circuit are merged.

2. Description of the Related Art

Silicide is an alloy of silicon and a metal, formed by stacking a refractory metal or a transition metal on polysilicon, and annealing the resultant structure. Silicide has been used recently for electrodes and interconnections of semiconductor devices. This is because silicide can provide low resistance which is not possible using polysilicon. Thus, when a silicide layer is formed on a gate electrode and source and drain areas of a MOS transistor, the interconnection material has low resistance, allowing the semiconductor device to operate at high speed.

The technology for forming silicide has been applied to various memory devices, logic devices or bipolar devices. In order to realize high speed operation of a dynamic random access memory (DRAM) and metal oxide semiconductor (MOS) transistors such as in a merged DRAM logic, a selective silicide layer must be formed only on gate electrodes in a predetermined area of the MOS transistors, but the silicide layer must be concurrently formed on the source and drain areas as well as the gate electrodes in other areas of the merged DRAM logic. Here, by typical photo etching, when the insulating layer formed on the gate electrode of the MOS transistor is patterned to expose the gate electrode, misalignment occurs, causing the gate electrode not to be exposed, or the source and drain areas adjacent to the gate electrode to be exposed to form a silicide layer.

Thus, the silicide layer must be selectively formed only on the gate electrodes in a predetermined area of the MOS transistors, and concurrently formed in the source and drain areas as well as the gate electrodes in other areas of the merged DRAM logic.

SUMMARY OF THE INVENTION

It is an objective of the present invention to provide a method for forming a self-aligned selective silicide layer using chemical mechanical polishing (CMP) in which gate electrodes of an area for selectively forming silicide are exposed using CMP in a self-aligned manner, and then silicide is formed using $CoSi_x$, to ensure low contact resistance and to suppress misalignment.

Accordingly, to achieve the above objective according to a first embodiment of the present invention, in a semiconductor integrated circuit including a first area in which a silicide layer is formed only on gate electrodes, and a second area in which a silicide layer is formed both on gate electrodes and on drain and source areas, a gate pattern having gate spacers formed on both sidewalls is formed on a semiconductor substrate where an isolation region is defined. A polishing stopper layer is deposited on the entire surface of the resultant structure to a predetermined thickness. Subsequently, an oxide layer is formed on the polishing stopper layer to a predetermined thickness. Chemical mechanical polishing is performed on the oxide layer until the polishing stopper layer is exposed. The oxide layer is eliminated entirely from the second area. The polishing stopper layer exposed on the gate electrode of the first area, and the polishing stopper layer on the entire surface of the second area are concurrently eliminated. A metal layer for forming a first silicide layer is stacked on the resultant structure, and then the semiconductor substrate where the metal layer is stacked is annealed to form a first silicide layer. Subsequently, the resultant structure where the first silicide layer is formed is covered with a first insulating layer, and first contact holes exposing the semiconductor substrate are formed. Additionally, a second silicide layer, e.g., a $CoSi_x$ layer may selectively be formed at the bottoms of the first contact holes in the first area. Then, in the first area, a bit line pattern is formed filling the first contact hole, and in the second area, a pad layer is formed filling the first contact holes. Then a second insulating layer is formed thereon as an interlayer dielectric. The second insulating layer is patterned to form second contact holes exposing source areas of the first area.

According to a preferred embodiment of the present invention, a DRAM device is formed in the first area, and a logic device is formed in the second area. Also, the polishing stopper is formed of a nitride layer having a thickness of 300~1500 Å, and the oxide layer is formed to at least twice the height of the gate electrode, by chemical vapor deposition (CVD).

Preferably, the CMP is performed by over polishing to the top of the gate pattern in the field oxide area, until the polishing stopper on the gate electrodes of the field oxide layer and in the active area are sufficiently exposed.

Preferably, the oxide layer in the second area is eliminated by wet etching using HF as an etchant, and the polishing stopper is eliminated by dry etching.

It is also preferable that a metal layer for forming the silicide layer is formed of one selected from the group consisting of Ti, W, Mo, Ta, Co, Ni and TiW.

To accomplish the above object according to a second embodiment of the present invention, in a semiconductor integrated circuit including a first area where a silicide layer is formed only on gate electrodes, and a second area where a silicide layer is formed both on gate electrodes and on drain and source areas, using chemical mechanical polishing, gate electrodes and a gate protective layer are sequentially formed on a semiconductor substrate where an isolation area is formed. Gate spacers are formed on both sidewalls of the structure consisting of the gate electrode and the gate protective layer. An oxide layer of a predetermined thickness is stacked on the entire surface of the resultant structure. Subsequently, parts of the oxide layer are eliminated by chemical mechanical polishing to expose the gate protective layer. The exposed gate protective layer in the first and second areas is eliminated. The rest of the oxide layer in the second area is eliminated to expose the semiconductor substrate. A metal layer for forming a first silicide layer is stacked on the resultant structure. The semiconductor substrate where the metal layer is stacked is annealed to form the first silicide layer. The resultant structure where a first silicide layer is formed is covered with a first insulating layer, and patterned to form first contact holes exposing the semiconductor substrate. Additionally, a second silicide layer, e.g., a $CoSi_x$ layer may selectively be formed at the bottoms of the first contact holes in the first area. Subsequently, in the first area, a bit line pattern is formed filling the first contact holes and in the second area, a pad layer is formed filling the first contact holes. A second insulating layer is formed thereon as an interlayer dielectric. The second insulating layer is patterned, to form second contact holes exposing source areas of the first area.

According to a preferred embodiment of the present invention, in the first area, a DRAM device is formed, and in a second area, a logic device is formed.

According to the present invention, in a process of manufacturing a merged DRAM logic (MDL), the gate electrodes are exposed in a self-aligned manner, using chemical mechanical polishing (CMP), to thereby suppress misalignment, and the contacts are made using $CoSi_x$, to ensure low resistance of an interconnection material.

BRIEF DESCRIPTION OF THE DRAWINGS

The above objectives and advantages of the present invention will become more apparent by describing in detail a preferred embodiment thereof with reference to the attached drawings in which:

FIGS. 1 through 8 are sectional views illustrating a method for forming a self-aligned selective silicide layer using chemical mechanical polishing (CMP) in a merged DRAM logic (MDL) according to a first embodiment of the present invention; and FIGS. 9 through 15 are sectional views illustrating a method for forming a self-aligned selective silicide layer using CMP in an MDL according to a second embodiment of the present invention.

DESCRIPTION OF THE PREFERRED EMBODIMENTS

Figure 3:
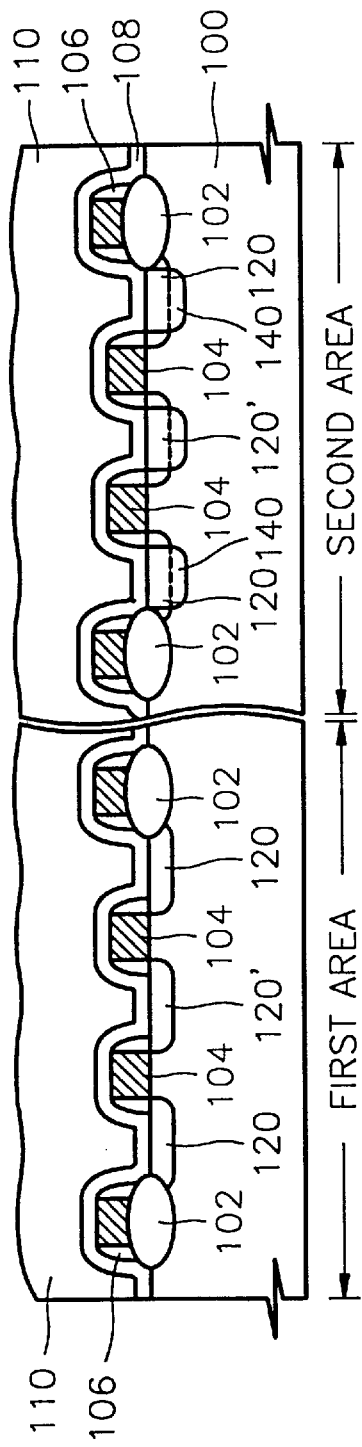

A polishing stopper as described herein is not limited to a SiN layer, but may be any material by which polishing is suppressed in chemical mechanical polishing (CMP) to prevent a gate pattern from being damaged. Thus, this invention may be embodied in many different forms and should not be construed as being limited to the embodiments set forth herein.

Embodiment 1

Referring to FIG. 1, a gate pattern, in which gate spacers 106 are formed on both sidewalls of a gate electrode 104, is formed on a semiconductor substrate 100 in which a field oxide layer 102 is formed. Here, the gate electrode 104 is formed of polysilicon, and the gate spacer 106 is formed of SiN. Before forming the gate spacers 106, $N^-$ ions, e.g., P or As, are implanted into the entire surface of the semiconductor substrate 100 of first and second areas, using the gate electrodes 104 as a mask, to form source and drain areas having shallow junctions.

The field oxide layer 102 may be a LOCOS layer, a trench field oxide layer or a selective polysilicon oxidation (SEPOX) layer. Subsequently, an $N^+$ impurity such as phosphorus (P) or arsenic (As) is implanted only into the second area, using the gate pattern having the gate spacer 106 as a mask. Thus, $N^-$ source and drain areas 120 and 120' are formed in the first area, and $N^+$ source and drain areas 140 and 140' in the source and drain areas 120 and 120' are formed in the second area. Here, alternatively, a P-type impurity instead of the N-type impurity may be used.

Referring to FIG. 2, a polishing stopper layer 108 is formed on the entire surface of the semiconductor substrate where the gate pattern is formed, to a thickness of 300~1500 Å. The polishing stopper layer 108 has a polishing selectivity with respect to an oxide layer in chemical mechanical polishing (CMP) in a subsequent process for etching back the oxide layer to a predetermined thickness, to thereby function as the polishing stopper, and has an etching selectivity with respect to the oxide layer in wet etching for eliminating the oxide layer in the second area, to thereby function as an etching stopper.

Referring to FIG. 3, an oxide layer 110 is deposited on the entire surface of the semiconductor substrate where the polishing stopper 108 is formed, by chemical vapor deposition (CVD). Preferably, the deposition thickness of the oxide layer 110 is at least twice the height of the gate electrode 104.

Figure 4:
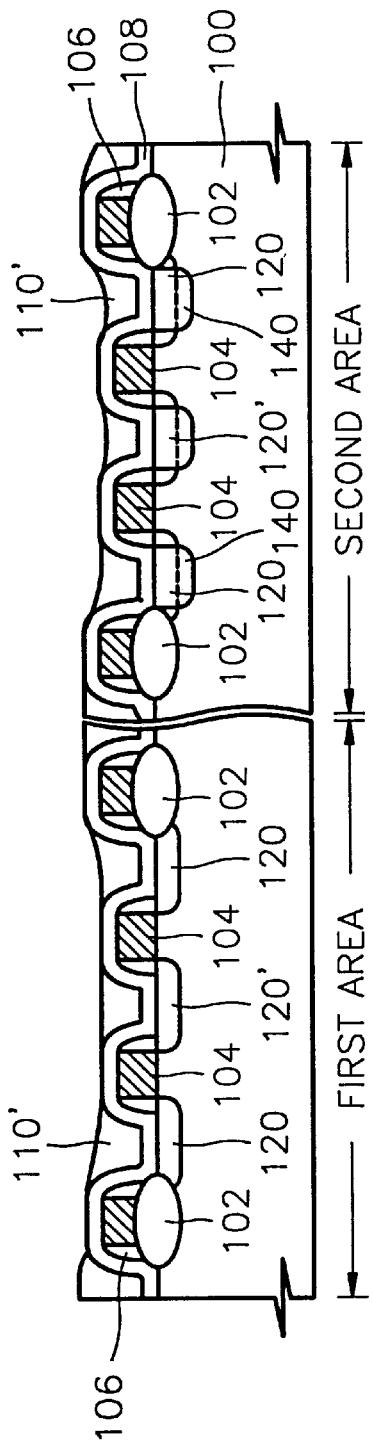

Referring to FIG. 4, chemical mechanical polishing (CMP) is performed on the entire surface of the semiconductor substrate where the oxide layer 110 is deposited. At this time, preferably, over polishing is employed to expose the polishing stopper 108 on the gate pattern of an active area between the field oxide layers 102. Here, preferably, the over polishing is performed down to the top of the gate pattern on the field oxide layer 102. At this time, the gate electrodes on the field oxide layer 102 are exposed by the CMP earlier than the other gate electrodes. Thus, polysilicon forming the gate electrodes 104 on the field oxide layer 102 may be damaged. However, the polishing stopper 108 according to the present invention may be a buffer for preventing the gate electrodes 104 from being damaged.

Referring to FIG. 5, a photo resist film is coated on the semiconductor substrate where the CMP process was performed, and exposure and development are performed to form a photo resist pattern 112 covering all of the first area and exposing only the second area. Subsequently, an oxide layer 110' on the surface of the second area is entirely eliminated by wet etching. The wet etching is performed using an etchant including hydrofluoric acid, to ensure etching selectivity with respect to the polishing stopper 108. Thus, the polishing stopper 108 functions as an etching stopper due to a difference in the etching selectivity.

Referring to FIG. 6, ashing is performed on the semiconductor substrate where the wet etching was performed, to eliminate the photo resist pattern 112. Subsequently, the polishing stopper 108 which is a SiN layer is eliminated by dry etching. Thus, in the first area, only the gate electrode 104 is exposed in a selective and self-aligned manner, and in the second area, the source and drain areas 140 and 140' as well as the gate electrode 104 are exposed. Thus, in the first area, even though the gate electrode 104 is very narrow, the gate pattern is exposed by the CMP in a self-aligned manner, to thereby suppress misalignment of the gate electrode 104 in forming the silicide layer.

Figure 7:
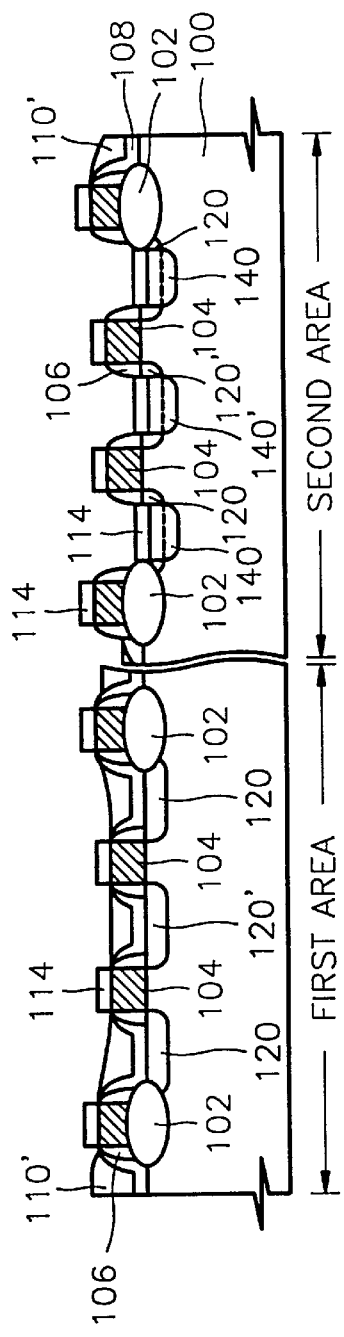

Referring to FIG. 7, a metal layer for forming a first silicide layer, e.g., Ti, W, Mo, Ta, Co, Ni, or TiW, is stacked on the entire surface of the semiconductor substrate having the first area where the gate electrode 104 is selectively exposed and the second area where the gate electrode 104 and the source and drain areas 140 and 140' are exposed. Subsequently, a silicide layer 114, which is an alloy of silicon and a metal, is formed by annealing. Here, process conditions for annealing vary depending on the type of stacked metal layer. Accordingly, in the first area, the silicide layer 114 is formed only on the gate electrode 104 of polysilicon, and a metal layer without silicidation remains on a portion covered with the oxide layer 110'. In the second area, the silicide layer 114 is formed only on areas of the semiconductor substrate 100 having silicon, i.e., on the source and drain areas 140 and 140' and on the gate electrode 104, and the metal layer without silicidation remains on the gate spacer 106 and the field oxide layer 102. Thus, when the remaining metal layer without silicidation is removed using wet etchant, the silicide layer 114 without misalignment can be selectively formed only on the gate electrode 104 in the first area, and on the gate electrode 104 and the source and drain areas 140 and 140' in the second area.

Figure 8:
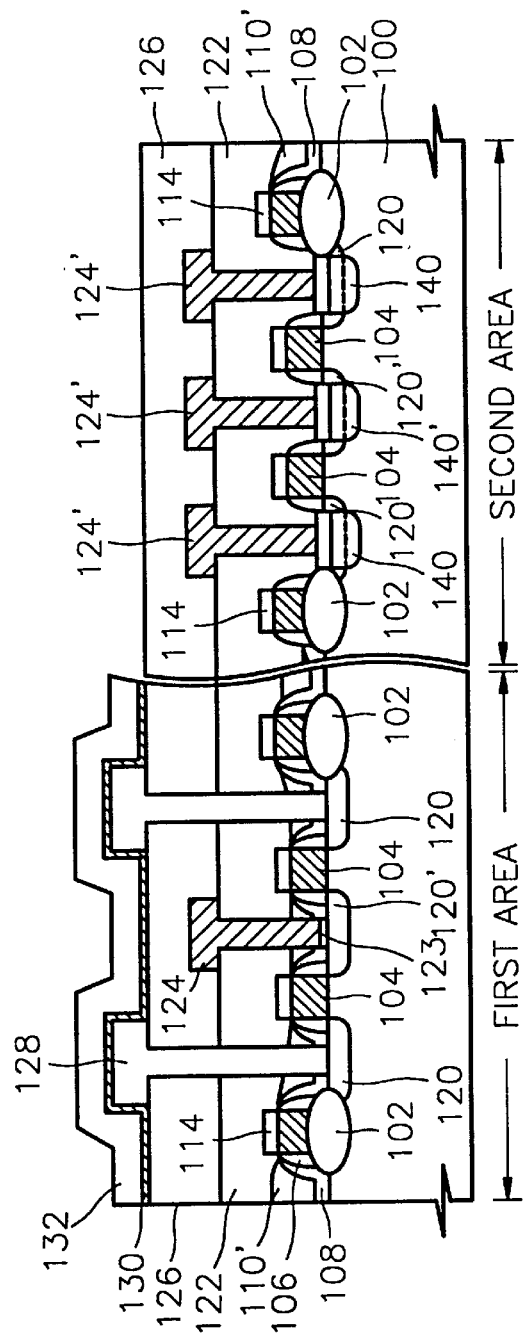

Referring to FIG. 8, a first insulating layer 122 is stacked as an interdielectric layer on the entire surface of the semiconductor substrate having the silicide layer 114. The first insulating layer 122 is patterned to form a contact hole exposing the surface of the semiconductor substrate 100. That is, the drain areas 120' doped with an N⁻ impurity are exposed in the first area, and the silicide layer 114 on the source and drain areas 140 and 140' are exposed in the second area where a logic device is formed.

Here, a low contact resistance Rc, with respect to a contact portion is required for stable operation of a merged DRAM logic (MDL) device. Particularly, it is very important in a metal process to ensure low resistance in a deep contact hole having a size of 0.2 μm or less. Thus, a second silicide layer 123 using $CoSi_x$ is formed only on the contact hole bottom in the first area. This is because the $CoSi_x$ has better electrical characteristics of low resistance and junction leakage current than $TiSi_x$. In detail, when $TiSi_x$ is used as the second silicide layer, an oxide layer on the surface of the $TiSi_x$ layer is relatively thick in the silicidation process, so that it is difficult to realize the low resistance contact portion, and Ti penetrates deeply into the surface of the semiconductor substrate in the annealing process, to deteriorate electric characteristics of the contact. Particularly, in the MDL device having a fine linear width of 2 μm or less and a shallow junction, the second silicide layer 123 of Co instead of Ti gives the advantage of low contact resistance. Forming the second silicide layer 123 may be omitted. Subsequently, a conductive material is stacked and patterned to form a bit line pattern 124 in the first area and a pad layer 124' in the second area.

Subsequently, a second insulating layer 126 is stacked as an interdielectric layer for forming a capacitor, on the entire surface of the semiconductor substrate. The resultant structure is patterned to form a contact hole exposing a source area only in the first area. A storage node 128 is formed filling the contact hole, and a dielectric layer 130 and a plate node 132 are sequentially stacked to complete a self-aligned selective suicide layer of an MDL device through chemical mechanical polishing according to the first embodiment.

Embodiment 2

A method for forming a self-aligned selective silicide layer using chemical mechanical polishing according to a second embodiment of the present invention is the same as the first embodiment, except that, a polishing stopper is formed only on the gate electrode instead of all over the semiconductor substrate.

Referring to FIG. 9, a field oxide layer 202 for isolation is formed on a semiconductor substrate 200, a gate oxide layer (not shown) is formed, and then a gate electrode layer formed of polysilicon is stacked on the entire surface of the semiconductor substrate. Subsequently, an arbitrary film functioning as a polishing stopper, such as a nitride layer, is stacked on the gate electrode layer to a thickness of 100~1000 Å. Gate electrodes 204 formed of polysilicon and gate protective layers 216 formed of the nitride layer are formed by etching the gate electrode layer and the nitride layer, using photolithography. Subsequently, N⁻ ions are implanted using the gate electrodes 204 and the gate protective layers 216 as an ion implantation mask. An insulating layer for a spacer, such as a nitride layer, is stacked on the resultant structure where the gate electrodes 204 and the gate protective layers 216 are formed, to a predetermined thickness, and then the resultant structure is anisotropically etched to form gate spacers 206 on the sidewalls of the gate electrodes 204 and the gate protective layers 216. After exposing the second area, an N⁺ impurity is implanted into the semiconductor substrate 200 using the gate spacers 206 as an ion implantation mask. Thus, source and drain areas 220 and 220', where N⁻ ions are implanted, are formed in the first area, and source and drain areas 240 and 240', where N⁺ ions are implanted, are formed in the second area.

Referring to FIG. 10, an oxide layer 210 is deposited on the resultant structure where the source and drain areas 220 and 220' are formed, through chemical vapor deposition (CVD). Preferably, the deposition thickness of the oxide layer 210 is at least twice the height of the gate electrode 204.

Figure 11:
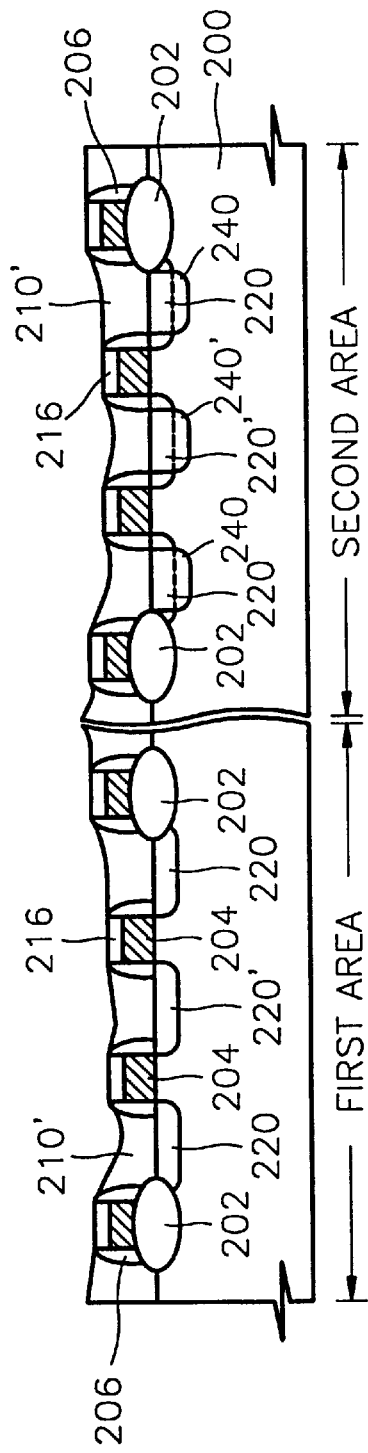

Referring to FIG. 11, a predetermined thickness of the oxide layer 210 is eliminated through CMP. At this time, preferably, over polishing is performed until the surfaces of the gate protective layers 216 formed on the field oxide layer 202 and the active area are exposed. Here, the gate protective layers 216 function as a polishing stopper. Subsequently, the gate protective layer 216 in the first and second area is eliminated through dry etching.

Figure 12:
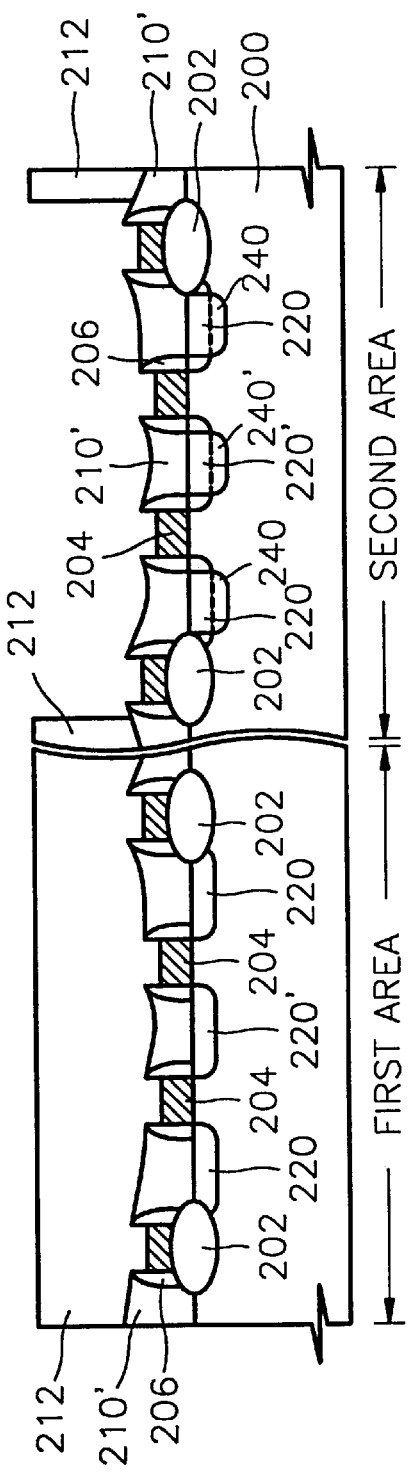

Referring to FIG. 12, a photo resist layer is coated on the semiconductor substrate where the gate protective layer 216 was eliminated, and exposure and development are performed to form a photo resist pattern 212 covering only the first area, and exposing the second area. Subsequently, the oxide layer 210' in the second area is eliminated using wet etchant, including HF, to expose the source and drain areas 240 and 240'.

Figure 13:
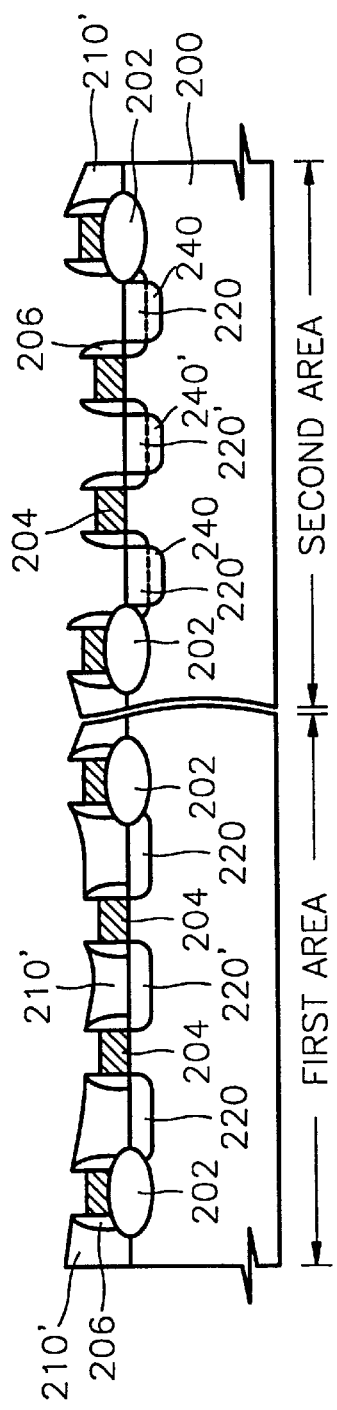

Referring to FIG. 13, the photo resist pattern 212 is eliminated through ashing from the resultant structure where the source and drain areas 240 and 240' have been exposed. Thus, in a self-aligned manner, the gate electrodes 204 are exposed in the first area, and the source and drain areas 240 and 240' as well as the gate electrodes 204 are exposed in the second area, to thereby avoid misalignment.

Figure 14:
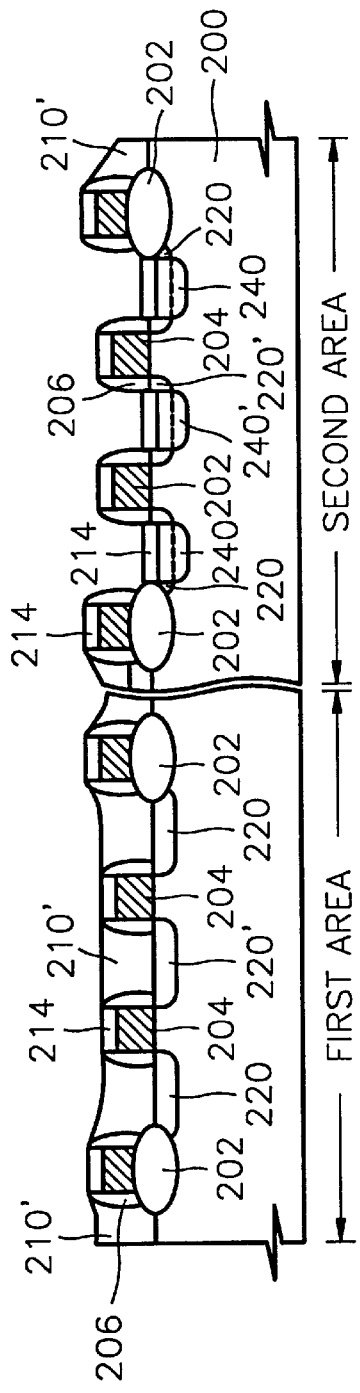

Referring to FIG. 14, a refractory metal for forming a first silicide layer, e.g., one selected from the group consisting of Ti, W, Mo, Ta, Co, Ni and TiW, is deposited on the entire surface of a semiconductor substrate having a partially exposed silicon layer of the semiconductor substrate 200 and the gate electrode 204, in a self-aligned manner, to form a first silicide layer 214 through a rapid thermal annealing (RTP). At this time, the first suicide layer 214 is formed in the gate electrode 204 including silicon and in the source and drain areas 240 and 240', and silicidation does not occur in the gate spacer 206 and the oxide layer 210'. The refractory metal without silicidation is eliminated by wet etching, so that the first silicide layer 214 is formed only on the gate electrodes 204 in the first area, and on the gate electrodes 204 and the source and drain areas 240 and 240' in the second area, without errors due to misalignment.

Figure 15:
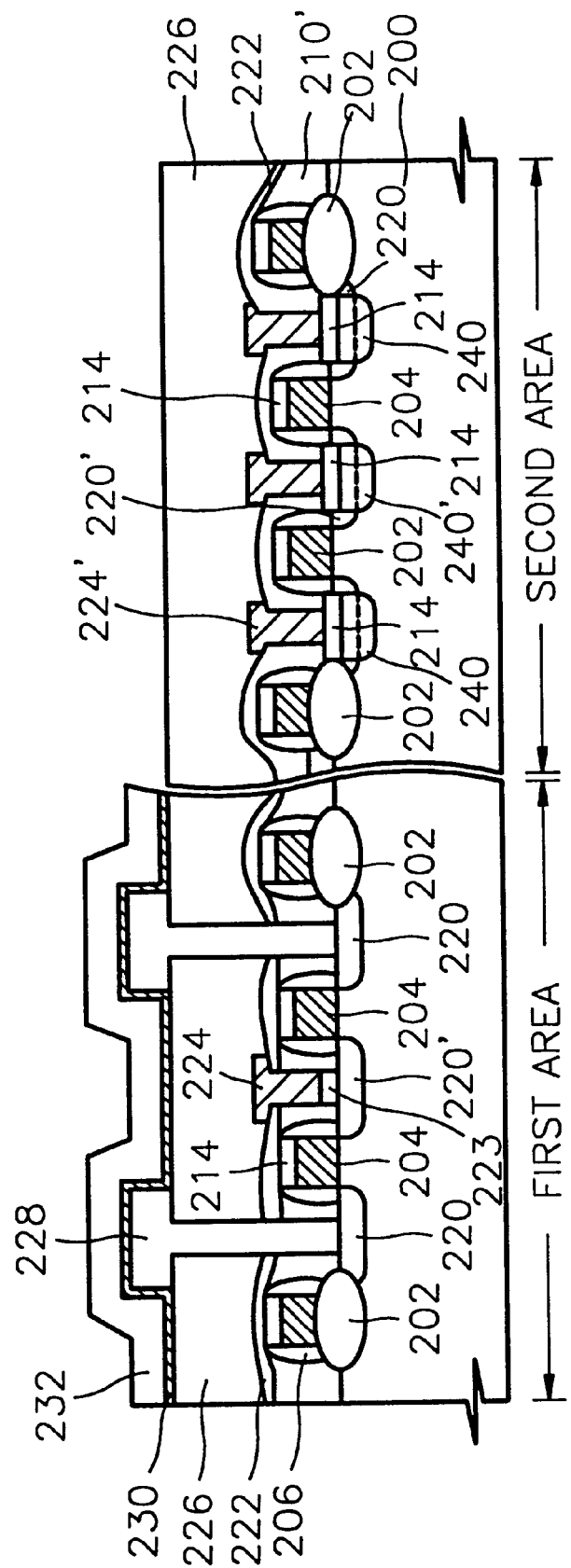

FIG. 15 is a sectional view of a first area where a DRAM device is formed, and a second area where a logic device is formed.

Referring to FIG. 15, a first insulating layer 222 is stacked as an interdielectric layer on the resultant structure where the selective silicide layer 214 is formed, and a contact holes are formed exposing the drain area 220' in the first area and the source and drain areas 240 and 240' in the second area. Then, a second silicide layer 223 using $CoSi_x$ is formed on the bottom of the contact holes only in the first area in the same manner as in the first embodiment to achieve a low contact resistance Rc. Formation of the second silicide layer 223 may be omitted. A conductive material filling the contact hole is deposited and the resultant structure is patterned, to form a bit line pattern 224 in the first area and a pad layer 224' in the second area. Subsequently, a second insulating layer 226, which is an interdielectric layer for forming a capacitor in the first area, is formed thickly on the entire surface of the semiconductor substrate, and the entire surface of the resultant is etched back to be planarized. The second insulating layer 226 is patterned to form a contact hole exposing only the source area 220 in the first area. Subsequently, a conductive material for a storage node 228 is deposited to fill the contact hole. Then the resultant structure is patterned, to form a storage node pattern 228. In the first area, a dielectric layer 230 and a plate node 232 are stacked on the storage node 228, to form a DRAM device including a capacitor in the first area, and a logic device in the second area.

Accordingly, the polishing stopper layer is formed on the entire surface of the semiconductor substrate, or only on the gate electrode, and then an oxide layer is deposited and CMP is performed, to thereby selectively form a first silicide layer only on the gate electrode without misalignment, in the process of manufacturing a semiconductor device. Also, the second silicide layer is formed in the drain area of the first area where the first silicide layer is not formed, using $CoSi_x$, to ensure low contact resistance and reduce junction leakage current.

It should be understood that the invention is not limited to the illustrated embodiments and that many changes and modifications can be made within the scope of the invention by a person skilled in the art.

What is claimed is:

1. A method of using chemical mechanical polishing (CMP) for forming a self-aligned selective silicide layer of a semiconductor integrated circuit, including a semiconductor substrate having a first area comprising a plurality of first gate electrodes and a second area comprising a plurality of second gate electrodes, wherein in said second area said self-aligned silicide layer is formed both on said second gate electrodes and on drain and source areas and in said first area said self-aligned silicide layer is formed only on said first gate electrodes, comprising:

forming said first and second gate electrodes on the semiconductor substrate, each having gate spacers formed on two sidewalls thereof, in active regions of the first and second areas respectively of on the semiconductor substrate;

depositing a polishing stopper layer to a predetermined thickness on an entire top surface of the semiconductor substrate;

forming an oxide layer to a predetermined thickness on the polishing stopper layer;

performing chemical mechanical polishing on the oxide layer until the polishing stopper layer is exposed;

eliminating the oxide layer from the second area;

eliminating the exposed polishing stopper layer from the first gate electrodes of the first area, and from the entire second area;

stacking a metal layer for forming the self-aligned selective silicide layer; and annealing the semiconductor substrate where the metal layer is stacked to form the self-aligned selective silicide layer.

2. The method of claim 1, wherein a DRAM device is formed in the first area, and a logic device is formed in the second area.

3. The method of claim 1, wherein the polishing stopper layer is SiN.

4. The method of claim 1, wherein the polishing stopper layer is deposited to a thickness of 300~1500 Å.

5. The method of claim 1, wherein the predetermined thickness of the oxide layer is at least twice a height of the first and second gate electrodes.

6. The method of claim 1, wherein the chemical mechanical polishing includes over polishing, to expose the polishing stopper layer on said first and second gate electrodes and on gate electrodes on a field oxide layer on the semiconductor substrate.

7. The method of claim 6, wherein the over polishing is performed to a depth at least equal to a height of said gate electrodes on the field oxide layer.

8. The method of claim 1, wherein the metal layer for forming the first silicide layer is formed of one selected from the group consisting of Ti, W, Mo, Ta, Co, Ni and TiW.

9. The method of claim 1, further comprising:

covering the semiconductor substrate with a first insulating layer, and patterning said first insulating layer to form first contact holes exposing the semiconductor substrate;

forming a second silicide layer on the semiconductor substrate exposed by the first contact holes in the first area; and forming a bit line pattern in the first area and a pad layer in the second area, after annealing the semiconductor substrate.

10. The method of claim 9, wherein the second silicide layer is formed of $CoSi_x$.

11. A method of using chemical mechanical polishing (CMP) for forming a self-aligned selective silicide layer of a semiconductor integrated circuit, including a semiconductor substrate having a first area comprising a plurality of first gate electrodes and a second area comprising a plurality of second gate electrodes, wherein in said second area said self-aligned silicide layer is formed both on said second gate electrodes and on drain and source areas and in said first area said self-aligned silicide layer is formed only on said first gate electrodes, comprising:

sequentially forming the first and second gate electrodes and a plurality of gate protective layers thereon on a top surface of a semiconductor substrate;

forming gate spacers on two sidewalls of the gate electrodes and the gate protective layers;

stacking an oxide layer of a predetermined thickness on the top surface of the semiconductor substrate;

eliminating portions of the oxide layer by chemical mechanical polishing to produce exposed gate protective layers;

eliminating the exposed gate protective layers in the first and second area;

eliminating the oxide layer completely in the second area to expose the semiconductor substrate;

stacking a metal layer for forming said self-aligned selective silicide layer on the semiconductor and substrate; and annealing the semiconductor substrate where the metal layer is stacked to form said self-aligned selective silicide layer.

12. The method of claim 11, wherein a DRAM device is formed in the first area, and a logic device is formed in the second area.

13. The method of claim 11, further comprising:

covering the top surface of the semiconductor substrate with a first insulating layer;

pattern said first insulating layer to form first contact holes exposing the semiconductor substrate;

forming a second suicide layer on the semiconductor substrate exposed by the first contact holes in the first area; and forming a bit line pattern in the first area and a pad layer in the second area.

14. The method of claim 13, wherein the second silicide layer is formed of $CoSi_x$.

* * * * *